United States Patent [19]

Desu et al.

[11] Patent Number: 5,527,567

[45] Date of Patent: Jun. 18, 1996

[54] METALORGANIC CHEMICAL VAPOR DEPOSITION OF LAYERED STRUCTURE OXIDES

[75] Inventors: Seshu B. Desu; Wei Tao; Chien H. Peng; Tingkai Li; Yongfei Zhu, all of Blacksburg, Va.

[73] Assignees: Ceram Incorporated; Sharp Kabushiki Kaisha; Virginia Tech Intellectual Properties, Inc

[21] Appl. No.: 454,029

[22] Filed: May 30, 1995

Related U.S. Application Data

[63] Continuation-in-part of Ser. No. 300,339, Sep. 2, 1994, Pat. No. 5,478,610.

[51] Int. Cl.$^6$ ............................................. H05H 1/20
[52] U.S. Cl. ............................... 427/573; 427/58; 427/79; 427/99; 427/126.2; 427/163.2; 427/255.3; 427/294; 427/314; 427/376.2; 427/380; 427/419.2; 427/574; 427/579; 427/583; 427/586; 427/595
[58] Field of Search .............................. 427/573, 574, 427/579, 583, 586, 595, 58, 79, 99, 126.2, 163.2, 255.3, 294, 314, 376.2, 380, 419.2

[56] References Cited

PUBLICATIONS

Fukushima, Jun; Kodaira, Kohei; and Matsushita, Toru, "Preparation of ferroelectric PZT films by thermal decomposition of onganometallic compounds," *Journal of Materials Science* 19, (1984) pp. 595–598. (No month avail.).

Kashihara, K.; Itoh, H.; Tsukamoto, K.; and Akasaka, Y, "Formation of PZT Films by MOCVD," *Extended Abstracts of the 1991 International Conference on Solid State Devices and Materials*, Yokohama, 1991, pp. 192–194. (No month avail.).

Nakagawa, Taichi; Yamaguchi, Jiro; Okuyama, Masanori; and Hamakawa, Yoshihiro, "Preparation of PbTiO$_3$ Ferroelectric Thin Film by Chemical Vapor Deposition," *Japanese Journal of Applied Physics*, vol. 21, No. 10, Oct. 1982, pp. L655–L656.

Oikawa, Masaru and Toda, Kohji, "Preparation of Pb(Zr, Ti)O$_3$ thin films by an electron beam evaporation technique," *Applied Physics Letters*, vol. 29, No. 8 15 Oct. 1976, pp. 491–492.

Okada, Masaru; Tominaga, Koji; Araki, Teruhiko; Katayama, Shigehisa; and Sakashita, Yukio, "Metalorganic Chemical Vapor Deposition of c–Axis Oriented PZT Thin Films," *Japanese Journal of Applied Physics*, vol. 29, No. 4, Apr. 1990, pp. 718–722.

Okada, Akira, "Some electrical and optical properties of ferroelectric lead–zirconate–lead–titanate thin films," *Journal of Applied Physics*, vol. 48, No. 7, Jul. 1977, pp. 2905–2909.

(List continued on next page.)

*Primary Examiner*—Bernard Pianalto
*Attorney, Agent, or Firm*—Davis, Graham & Stubbs

[57] ABSTRACT

A method of fabricating high quality layered structure oxide ferroelectric thin films. The deposition process is a chemical vapor deposition process involving chemical reaction between volatile metal organic compounds of various elements comprising the layered structure material to be deposited, with other gases in a reactor, to produce a nonvolatile solid that deposits on a suitably placed substrate such as a conducting, semiconducting, insulating, or complex integrated circuit substrate. The source materials for this process may include organometallic compounds such as alkyls, alkoxides, β-diketonates or metallocenes of each individual element comprising the layered structure material to be deposited and oxygen. Preferably, the reactor in which the deposition is done is either a hot wall or a cold wall reactor and the vapors are introduced into this reactor either through a set of bubblers or through a direct liquid injection system. The ferroelectric films can be used for device applications such as in capacitors, dielectric resonators, heat sensors, transducers, actuators, nonvolatile memories, optical waveguides and displays.

37 Claims, 6 Drawing Sheets

OTHER PUBLICATIONS

Peng, Chien H.; Chang, Jhing–Fang; and Desu, Seshu B.,"Optical Properties of PZT, PLZT, and PNZT Thin Films," *Mat. Res. Soc. Symp. Proc.*, vol. 243, 1992 Materials Research Society, pp. 21–26. (No month avail.).

Ramesh, R.; Inam, A.; Chan, W. K.; Tillerot, F.; Wilkens, B.; Chang, C. C.; Sands, T.; Tarascon, J. M.; and Keramidas, V. G., "Ferrelectric $PbZr_{0.2}Ti_{0.8}O_3$ thin films on epitaxial Y–Ba–Cu–O," *Appl. Phys. Lett.* 59 (27) 30 Dec. 1991, pp. 3542–3544.

Sakashita, Yukio; Ono, Toshiyuki; Segawa, Hideo; Tominaga, Kouji; and Okada, Masaru, "Preparation and electrical properties of MOCVD–deposited PZT thin films," *Journal of Applied Physics*, 69 (12), 15 Jun. 1991, pp. 8352–8357.

Sreenivas, K.; Sayer, M.; Baar, D. J.; and Nishioka, M., "Surface acoustic wave propagation on lead zirconate titanate thin films," *Appl. Phys. Lett.* 52 (9), 29 Feb. 1988, pp. 709–711.

Takayama, Ryoichi and Tomita, Yoshihiro, "Preparation of epitaxial $Pb(Zr_x Ti_{1-x})O3$ thin films and their crystallographic, pyroelectric, and ferroelectric properties," *Journal of Applied Physics*, 65 (4) 15 Feb. 1989, pp. 1666–1670.

Yi, Guanghua; Wu, Zheng; and Sayer, Michael, "Preparation of $Pb(Zr,Ti)O_3$ thin films by sol gel processing: Electrical optical and electro–optic properties," *Journal of Applied Physics* 64 (5), 1 Sep. 1988, pp. 2717–2724.

METALORGANIC CHEMICAL VAPOR DEPOSITION OF LAYERED STRUCTURE OXIDES

CROSS REFERENCE TO RELATED APPLICATIONS

This is a continuation-in-part application Ser. No. 08/300,339 filed Sep. 2, 1994, U.S. Pat. No. 5,478,610.

FIELD OF INVENTION

This invention relates to the field of ferroelectric layered structure oxides in the thin film form, and methods of fabricating the same using metalorganic chemical vapor deposition processes. Such materials have uses in ferroelectric device applications such as capacitors, nonvolatile memories, sensors, displays, and transducers.

BACKGROUND OF THE INVENTION

Ferroelectric materials are characterized primarily by a spontaneous polarization, the orientation of which can be reversed by an electric field. In addition, these materials also display unique dielectric, pyroelectric, piezoelectric and electro-optic properties that are utilized for a variety of applications such as capacitors, dielectric resonators, heat sensors, transducers, actuators, nonvolatile memories, optical waveguides and displays. For device applications, however, it is useful to fabricate ferroelectric materials in the form of thin films so as to exploit these properties and the design flexibility of thin film geometries.

Device applications also require that the bulk properties of the ferroelectrics are achieved in the thin films and therefore it is necessary to employ a deposition technique that can provide optimum thin-film characteristics such as stoichiometry, crystallinity, density, microstructure and crystallographic orientation. Although a variety of deposition techniques have been used, the growth of the films with controlled properties at relatively low temperatures is still a challenge and several techniques are being explored to achieve this objective. In general, thin film deposition techniques can be classified into two major categories, i.e., (1) physical vapor deposition (PVD) and (2) chemical processes (see "The Materials Science of Thin Films", Milton Ohring, Academic Press, 1992; S. L. Swartz, IEEE Transactions on Electrical Insulation, 25(5), 1990, 935; S. B. Krupanidhi, J. Vac. Sci. Technol. A, 10(4), 1992, 1569). The chemical processes can further be divided into two subgroups i.e., chemical vapor deposition and wet chemical processes including sol-gel and metalorganic decomposition (MOD). Among the PVD techniques, the most commonly used methods for deposition of ferroelectric thin films are electron-beam evaporation, rf diode sputtering, rf magnetron sputtering, dc magnetron sputtering, ion beam sputtering, molecular beam epitaxy and laser ablation. PVD techniques require a high vacuum, usually better than $10^{-5}$ Torr. The advantages of PVD techniques are (1) dry processing, (2) high purity and cleanliness, and (3) compatibility with semiconductor integrated circuit processing. However, these are offset by disadvantages such as (1) low throughput, (2) low deposition rate, (3) difficult stoichiometric control, (4) high temperature post deposition annealing, and (5) high equipment cost.

The sol-gel and MOD processes for deposition of thin films are popular because of their simplicity. Additionally, they provide molecular homogeneity, high throughput, excellent compositional control and low capital cost since no vacuum is required. However, for ferroelectric thin films they are limited by film integrity problems during post deposition annealing and possible contamination problems that make them incompatible with semiconductor processing.

Of all the above mentioned techniques, metalorganic chemical vapor deposition technique (MOCVD) appears to be the most promising because it offers the advantages of simplified apparatus, excellent film uniformity, compositional control, high film densities, high deposition rates, excellent step coverage and amenability to large scale processing. The excellent film step coverage offered by MOCVD cannot be equaled by any other technique. Purity, controllability, and precision that have been demonstrated by MOCVD are competitive with molecular beam epitaxy (MBE). More importantly, novel structures can be grown easily and precisely. MOCVD is capable of producing an entire class of devices which utilize either ultra-thin layers or atomically sharp interfaces. In addition, different compositions can be fabricated using the same source.

Although MOCVD techniques are now being used to fabricate several demonstrative ferroelectric devices such as pyroelectric detectors, ultrasonic sensors, surface acoustic wave devices and several electro-optic devices, the primary impetus of recent activity in ferroelectric thin films is the large demand for commercial nonvolatile memories. As mentioned earlier, ferroelectric materials are characterized by a spontaneous polarization that can be reversed by reversal of the applied field. The polarization in the material shows hysteresis with the applied electric field; at zero field, there are two equally stable states of polarization, $+P_r$ or $-P_r$ as shown in FIG. 1 This type of behavior enables a binary state device in the form of a ferroelectric capacitor (metal-ferroelectric-metal) that can be reversed electrically. Either of these two states could be encoded as '1' or '0' in a computer memory and since no external field (power) is required to maintain the state of the device, it can be considered a nonvolatile memory device. To switch the state of the device, a threshold field (coercive field) greater than $+E_c$ or $-E_c$ is required. In order to reduce the required applied voltage, the ferroelectric materials need to be processed in the form of thin films. Integration of ferroelectric thin film capacitors into the existing VLSI results in a true nonvolatile random access memory device (see J. F. Scott and C. A. Paz de Araujo, Science, 246, (1989), 1400–1405). In addition to the nonvolatility, ferroelectric random access memories (FRAMs) also offer high switching speeds, low operating voltage (<5 V), wide operating temperature range and high radiation hardness. Furthermore, the ferroelectric thin films, electrodes and passivation layers can be deposited in separate small facilities thereby obviating the need for any changes in the existing on-line Si or GaAs VLSI production. In principle, FRAMs could eventually replace static RAMs (SRAMs) in the cache memory, dynamic RAMs (DRAMs) in the main system memory and electrical erasable programmable read only memories (EEPROMs) in look up tables.

Although ferroelectric thin films offer great potential for nonvolatile RAMs, commercial usage has been hindered largely by serious degradation problems such as fatigue, leakage current and aging that affect the lifetime of ferroelectric devices. A common source for these degradation properties in oxide ferroelectrics is the presence of defects such as oxygen vacancies in the materials. Considering the problem of fatigue, ferroelectrics are noted to lose some of their polarizability as the polarization state of ferroelectrics is repeatedly reversed. Fatigue (see I. K. Yoo and S. B. Desu, Mat. Sci. and Eng., B13, (1992), 319; I. K. Yoo and S. B.

Desu, Phys. Stat. Sol., a133, (1992), 565; I. K. Yoo and S. B. Desu, J. Int. Mat. Sys., 4, (1993), 490; S. B. Desu and I. K. Yoo, J. Electrochem. Soc., 140, (1993), L133) occurs because of both the relative movement of oxygen vacancies and their entrapment at the electrode/ferroelectric interface (and/or at the grain boundaries and domain boundaries). These defects are created during the processing of ferroelectric films (with the desired ferroelectric phase) and can be classified into intrinsic and extrinsic defects. Extrinsic defects are the impurities that are incorporated in the films during processing and can be controlled by controlling the processing environment. Intrinsic defects can be divided into two types: (a) defects such as Schottky defects that maintain stoichiometry and (b) defects that alter stoichiometry in the materials. Examples of the formation of these defects can be illustrated by considering the case of $PbZr_xTi_{1-x}O_3$ (PZT) which is the most widely investigated ferroelectric thin film material for nonvolatile memory applications. Schottky defects in perovskite ($ABO_3$) ferroelectrics such as PZT may be represented by a quasichemical reaction (in Kroger-Vink notation) as:

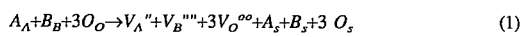

where $A_A$, $B_B$, and $O_O$ represent respectively occupied A, B and O sites; $V_A''$, $V_B''''$, $V_O^{oo}$ represent vacancies of A, B and O atoms; and $A_s$, $B_s$, and $O_s$ are the respective Schottky defects. A typical example of defects that alter the stoichiometry are vacancies that are formed due to the vaporization of one or more volatile components in multicomponent oxide materials. In the case of PZT, for example, a processing temperature of at least 600° C. is required to form the ferroelectric perovskite phase. However, the PbO component begins evaporating at temperatures as low as 550° C., resulting in the formation of oxygen and lead vacancies as shown below:

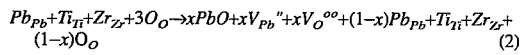

Intrinsic defects may also be created by stresses developed in the films during ferroelectric domain switching. It has been shown quantitatively [see S. B. Desu and I. K. Yoo, J. Electrochem. Soc., 140, (1993), L133] that relative migration of these oxygen vacancies and their entrapment at the electrode/ferroelectric interface (and/or at grain boundaries and domain boundaries) are important factors contributing to degradation in oxide ferroelectrics. The case of fatigue can be used to illustrate this point. As mentioned previously, fatigue in ferroelectric thin films is the loss of switchable polarization with increasing number of polarization reversals. Under an externally applied a.c. field (required to cause polarization reversal), the oxygen vacancies have a tendency to move towards the electrode/ferroelectric interface as a result of the instability of the interface. Eventually, these defects are entrapped at the interface and cause structural damage. This results in a loss of polarization in the material.

There are two possible solutions to overcome fatigue and other degradation problems. The first is to reduce the tendency for entrapment by changing the nature of the electrode/ferroelectric interface. Multilayer electrode structures using ceramic electrodes such as $RuO_2$ which minimize oxygen vacancy entrapment have been used to minimize fatigue problems in oxide ferroelectrics (see U.S. patent application Ser. No. 08/104,861 for Multilayer Electrodes for Ferroelectric Devices, filed Aug. 10, 1993, the contents of which are hereby incorporated by reference). The second solution involves the control of defect density. The extrinsic point defect concentration may be minimized by reduction of impurity concentration or through compensation of impurities. La and Nb doping are known to reduce the fatigue rate of PZT thin films on Pt electrodes by compensating for the vacancies [see S. B. Desu, D. P. Vijay and I. K. Yoo, Mat. Res. Soc. Symp., 335, (1994), 53.]. The strategies for minimizing the intrinsic defect concentration may include choosing compounds with inherently high defect formation energies or choosing compounds that have no volatile components in their sublattice exhibiting ferroelectric properties. Thus, another alternative to overcome fatigue and other degradation problems is to use a ferroelectric compound that does not contain any volatile components in its sublattice that exhibits ferroelectric properties. This criterion is satisfied by many of the known layered structure ferroelectric oxides.

In the past, layered structure oxides have not been seriously considered as candidates for ferroelectric device applications. Attempts were made to use $Bi_4Ti_3O_{12}$, which is a layered structure material, as a gate material on a transistor in a switching memory application (see S. Y. Wu, IEEE Transactions on Electron Devices, August 1974, pp.499–504). However, the device showed early degradation and was therefore unsuitable for memory applications (S. Y. Wu, Ferroelectrics, 1976, Vol.11, pp. 379–383). It is believed that development of any successful practical devices using layered structure oxides has been hindered by the inability to deposit high quality thin films of these materials.

SUMMARY OF THE INVENTION

It is an object of the present invention to provide a reliable metalorganic chemical vapor deposition process of making high quality layered structure oxide ferroelectric thin films which are useful in the applications of capacitors, nonvolatile memory devices, pyroelectric infrared sensors, optical displays, optical switches, piezoelectric transducers, and surface acoustic wave devices. It is a more specific object of this invention to provide a reliable deposition process of making layered structure oxide ferroelectric thin films for overcoming degradation problems such as fatigue, time dependent dielectric breakdown and aging in nonvolatile memories. Preferably, the layered structure oxide materials are $A_nBi_3Ti_{n+1}RO_{3n+9}$, $ABi_2R_2O_9$, $Bi_{2n+2}Ti_{4-n}O_{12-n}$, $A_{n+1}Bi_4Ti_{n+4}O_{15+3n}$ where A=Ca, Pb, Sr, or Ba; and R=Nb or Ta; and n=0 or 1. (See E. C. SubbaRao, J. Phys. Chem. Solids, 23, (1962), 665; B. Aurivillius, Arkiv Kemi, 1, (1949), 463; E. C. SubbaRao, J. Chem. Phys., 34, (1961), 695; G. A. Smolenski, V. A. Isupov and A. I. Agranovskaya, Fiz Tverdogo Tela, 3, (1961), 895). These compounds have a pseudo-tetragonal symmetry and the structure is comprised of stacking of perovskite-like units between $(Bi_2O_2)^{2+}$ layers along the pseudo-tetragonal c-axis. A large number of these compounds do not contain any volatile components in their sublattice that exhibits spontaneous polarization. The tendency for formation of defects such as oxygen vacancies and thereby the degradation problems such as fatigue may thus be minimized.

The materials of the invention include all of the above materials plus combinations and solid solutions of these materials. Preferably, the source materials are alkyls, alkoxides, beta-diketonates or metallocenes of the corresponding elements of the layered structure oxide elements. Preferably, the substrate materials are Pt-coated silicon wafers (Pt/Ti/$SiO_2$/Si), $RuO_x$-coated silicon wafers ($RuO_x$/$SiO_2$/Si), sapphire, or MgO. Preferably, the electrodes in the devices is Pt, $MO_x$ (where M=Ru, Ir, Rh, Os etc.), YBCO (yttrium barium copper oxide), LSCO (lanthanum strontium cobaltate), Au, Pd, Al, or Ni. Preferably the ratio of Ta to Nb is about 0.4.

DETAILS OF A PREFERRED EMBODIMENT

Figure 1:
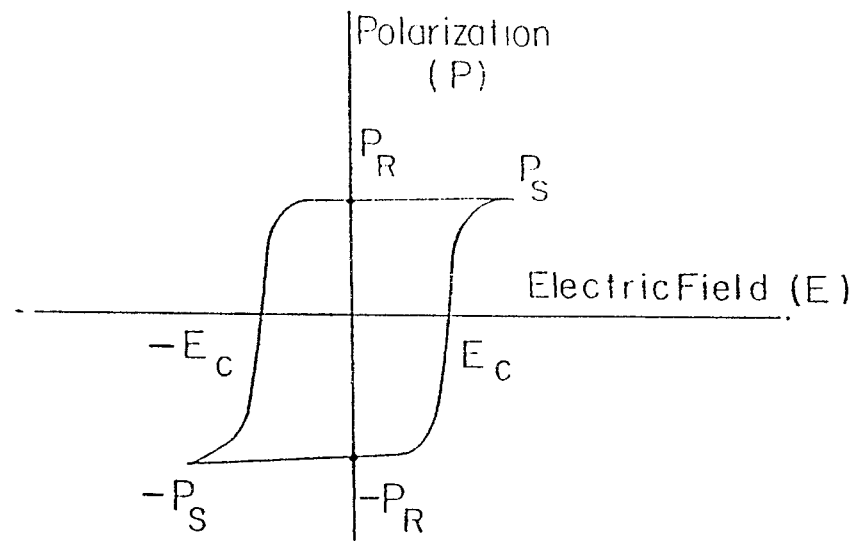
FIG. 1 shows a typical hysteresis loop of a ferroelectric material.

Metalorganic chemical vapor deposition essentially involves chemical reactions of a volatile compound of a material to be deposited to produce a nonvolatile solid that deposits on a suitably placed substrate. The reaction in almost all MOCVD processes involves co-pyrolysis of various organometallic compounds with other gases. This process is a variation of the basic chemical vapor deposition process; only the chemical nature of the precursors or starting materials are different. As implied by the name of the process, the precursor materials are metalorganic compounds. There are several variations of the basic MOCVD process. These may be broadly categorized as hot and cold wall processes based on how the temperature is maintained in the reactors, low pressure and atmospheric pressure processes, solid or liquid source delivery systems, and plasma or photo enhanced MOCVD processes.

The deposition of ferroelectric thin films using metalorganic vapor deposition methods has been performed in the past. However, most of the reported depositions are of perovskite type ferroelectrics such as lead titanate and lead zirconate titanates (see U.S. patent application Ser. No. 07/999,738 for Ferroelectric Thin Films Made by Metalorganic Chemical Vapor Deposition, filed Dec. 31, 1992; M. Okada, K. Tominaga, T. Araki, S. Katayama and Y. Sakashita, Japan. J. Appl. Phys., 29 (4), 1990, 718–722; B. S. Kwak, E. P. Boyd and A. Erbil, Appl. Phys. Lett. 53 (18), 1988, 1702–1704). The successful fabrication of layered structure ferroelectric films has not been accomplished using the MOCVD technique. The processes of the present invention in fabricating ferroelectric layered structure oxide films are demonstrated by describing a particular embodiment of the present invention in the context of fabrication of one particular ferroelectric device i.e., a ferroelectric capacitor for nonvolatile memory applications) using a particular class of layered structure ferroelectric materials (i.e., $SrBi_2Ta_2O_9$-$SrBi_2Nb_2O_9$ solid solutions). It is emphasized that the particular embodiments shown in the drawings and within this specification are for the purposes of example and should not be construed to limit the invention described later in the claims.

Figure 2:
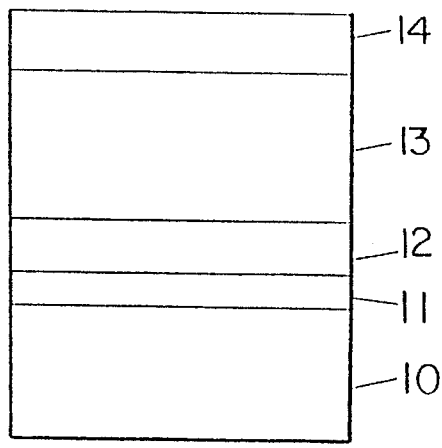
FIG. 2 show a schematic diagram of a typical ferroelectric capacitor
Figure 3:
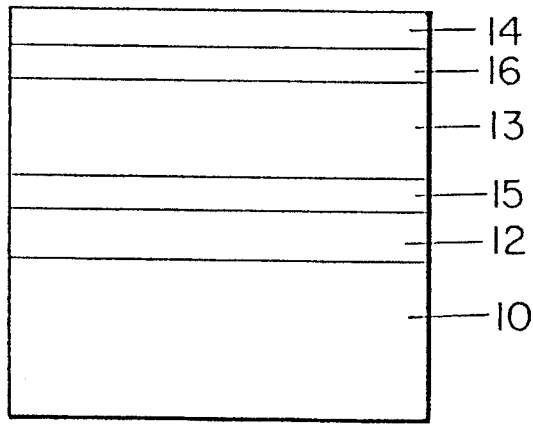
FIG. 3 shows a schematic diagram of a ferroelectric capacitor with buffer layers.

FIG. 2 shows a schematic of a ferroelectric capacitor in which the ferroelectric material is layered structure oxide. The ferroelectric capacitor is built on top of a substrate material 10 that may be silicon, a layer of silicon dioxide over a silicon chip, gallium arsenide, MgO, sapphire etc. Of course, the substrate 10 may be a multilayer structure having various circuit elements formed on a silicon chip having layers of silicon dioxide, polysilicon, implanted silicon layers etc. to form a complex integrated circuit. A thin bottom electrode layer 12 is deposited on top of the substrate by any of the standard PVD processes or chemical processes of thin film deposition mentioned earlier. The bottom electrode materials may be metals such as Pt, Au, Pt or Pd, conducting oxides such as $MO_x(0<x<2)$, where M=Ru, Rh, Ir, Os or Re, conducting nitrides such as TiN and ZrN or superconducting oxides such as $YBa_2Cu_3O_{7-x}$, $Bi_2Sr_2Ca_2Cu_3O_{10}$ etc. If required, an intermediate adhesion layer (12) may be included to improve the adhesion between the bottom electrode and the substrate material. For example, in the case of Pt on $Si/SiO_2$ substrates, a thin Ti interlayer is added to improve the adhesion between Pt and $SiO_2$. The ferroelectric material 13, which is a layered structure oxide, is then deposited on the bottom electrode by the processes of the invention described later. The top electrode material is then either deposited through a shadow mask to form the electrodes of the required area directly or deposited completely over the ferroelectric films and later etched after suitable masking using one of the standard VLSI etching processes such as reactive ion etching, wet etching, ion milling, plasma etching etc. to make several capacitors on a wafer. Once again, the materials of the top electrode may either be the same as used for the bottom electrodes or any combination thereof. If required, buffer layers 15 and 16 may be added between the ferroelectric layer 13 and the electrodes 12 and 14 at the bottom and top, respectively, as shown in FIG. 3.

The selection of the precursors is the most critical step in MOCVD for successful deposition of complex oxide films. The ideal precursors for MOCVD have to meet the requirements of high vapor pressure at low vaporization temperatures, low decomposition temperatures, large "window" between vaporization and decomposition temperatures, no contamination from organic constituents of the precursors, stability under ambient conditions and nontoxicity. In the present invention, several types of metallorganic compounds have been used as precursors to grow the complex layered structure films. These include metal alkyls, metal alkoxides, metal β-diketonates and metallocenes. Most of the metaloxide precursors have reasonable vapor pressures at relatively low temperatures. In general, metal oxides and metal β-diketonates are less volatile than their alkyl equivalents, but they are easier to handle and much less toxic. One of the assets of metallorganic precursors is that their physical and chemical properties can be tailored by making small changes in their chemical structure. For example, the volatility of a metal β-diketonate can be increased by varying the alkyl or fluoroalkyl group on the chelating ring.

Figure 4:
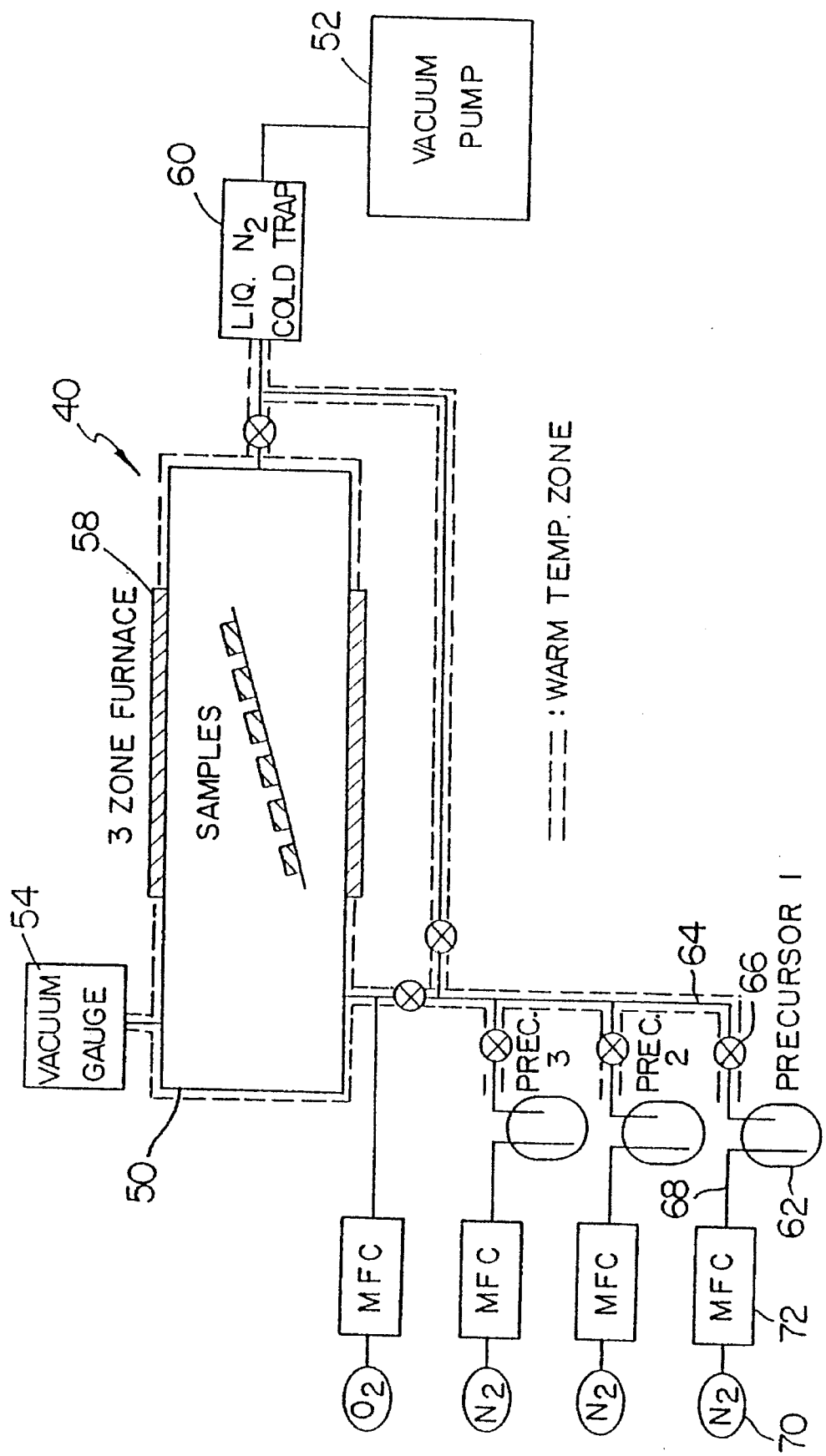
FIG. 4 shows a schematic diagram of a hot wall MOCVD system for growing the ferroelectric material in accordance with the present invention.

A schematic of the hot wall MOCVD apparatus 40 used in the present invention is shown in FIG. 4. The reaction chamber 50 was a stainless steel tube having an inside diameter of 75 mm. The chamber 50 was pumped to low pressures before deposition by a mechanical pump 52 and the pressure inside the chamber 50 was monitored by an MKS BARATRON pressure sensor 54. This sensor could monitor pressures in the range of 12 to $10^{-3}$ Torr. The temperature inside the chamber 50 was maintained by a resistively heated three zone furnace 58. To accomplish the condensation of the products and/or any kind of unreacted reagents, a cold trap 60 was placed between the reaction chamber 50 and the mechanical pump 52. The precursor material was packaged in a stainless steel bubbler 62 with two connections; one was connected to the reactor by a stainless steel line 64 with a manual valve 66 and the other was connected to a $N_2$ gas cylinder 70 with a mass flow controller 72. Aluminum housed mantle heaters with temperature controllers were used to control the temperatures of the precursors. The precursors were kept at the desired temperatures within ±5° C. during deposition. The paths between the furnace and the precursor bubblers were heated by heating tapes to a temperature ranging from 200° to 300° C. to prevent condensation or decomposition of the precursors. The apparatus of FIG. 4 shows several bubblers with their associated lines, mass flow controllers and gas cylinders.

Figure 5:
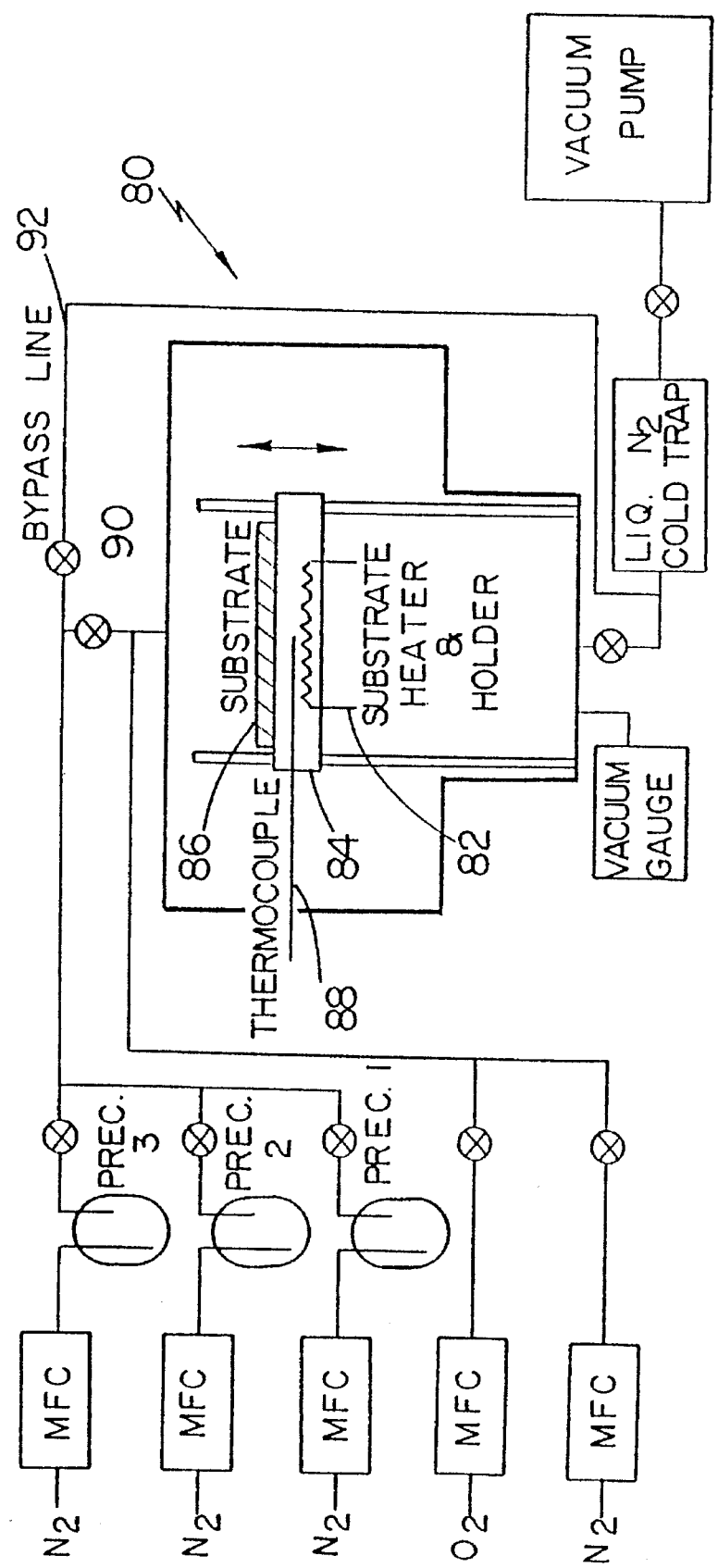
FIG. 5 shows a schematic diagram of a cold wall MOCVD system for growing the ferroelectric material.

A schematic of the cold-wall MOCVD apparatus 80 used in the present invention is shown in FIG. 5. In this reactor only the substrates were heated to high temperatures while the walls of the reactor were maintained at around 250° C. A three inch diameter substrate heater 82 that could be operated at a maximum temperature of 900° C. was employed. The temperature of the substrate heater 82 was position insensitive within an 8° C. range, and the variation in the temperature with time throughout the growth process was within 1° C. A substrate holder 84, made of INCONEL and placed in direct contact with the substrate heater 82, was used to hold the substrates 86. The substrate temperature was monitored by a thermocouple 88 which was placed inside the center of the substrate holder 84. The specimens were adhered on the substrate holder by silver paste. The silver paste was used to improve the heat conduction and temperature uniformity of specimens. The distance between the inlet 90 of the source mixture and the substrates 86 could be varied from 1.5 to 10 cm. The setup and control of the bypass line and the bubbler heaters were similar to those of the hot-wall apparatus. The bubblers used in the present invention have a cylindrical shape 1.5 inches in diameter and 6 inches high.

Figure 6:
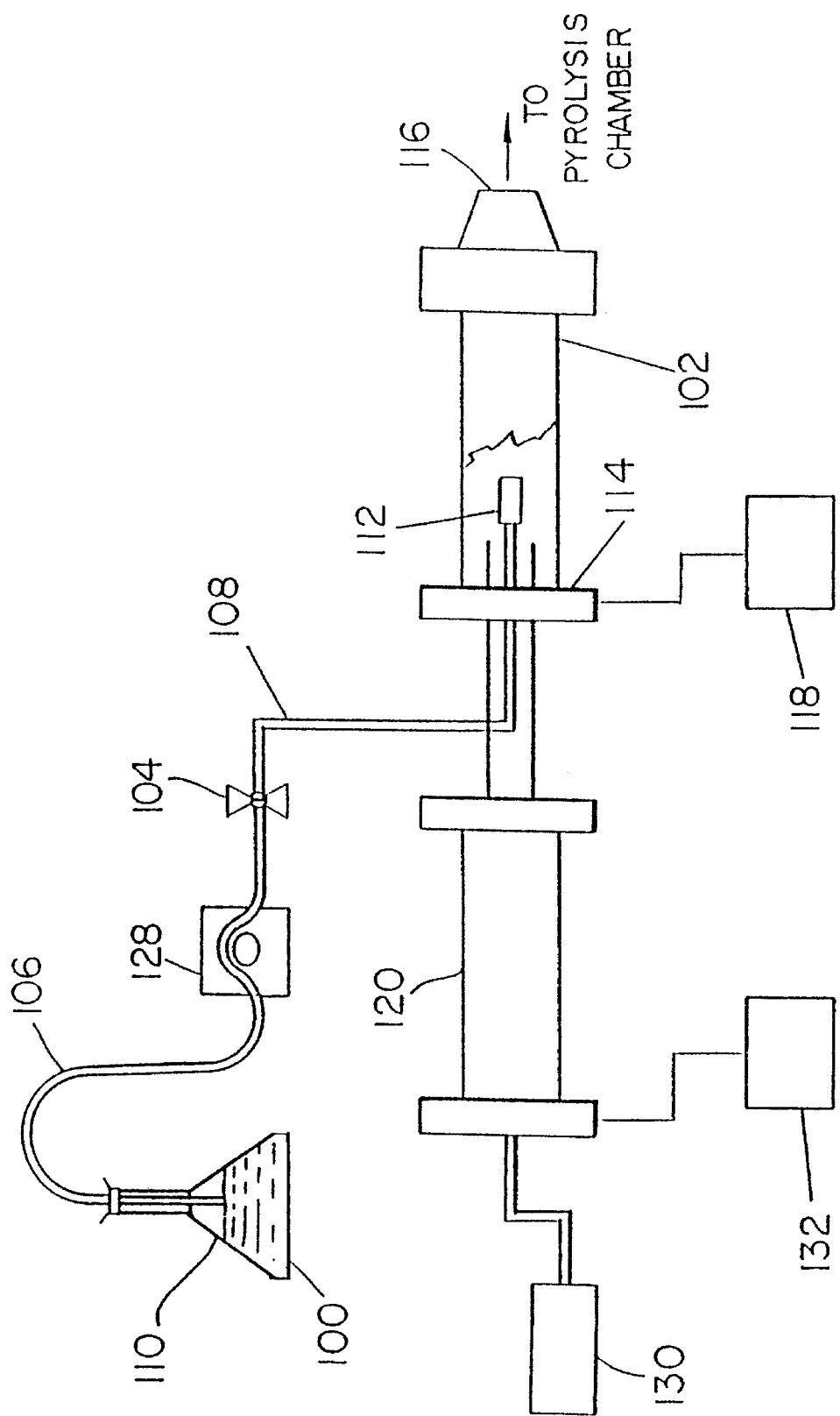
FIG. 6 shows a schematic diagram of the direct liquid injection system for vaporization of the source materials.

With the use of conventional bubblers as shown in FIGS. 4 and 5, it may sometimes be difficult to obtain precise control of the stoichiometry, especially in complex multicomponent oxides. In many cases, the precursor materials are solids which decompose at temperatures close to the temperature at which they sublime. During the deposition, the bubbler is held at sufficiently high temperatures to sublime the reagents and consequently significant decomposition of the growth reagents may occur during deposition leading to variations in the composition and poor reproducibility between different runs. Also, it may not always be possible to use volatile source reagents. To counter these drawbacks, in the present invention, we have also incorporated a method of liquid source delivery. In this method, the reagent source is held in the form of a liquid (for solid sources, a solvent is added to make it in the form of a liquid) and vaporized on a vaporization matrix structure at an elevated temperature. The vapor source is then transferred into the pyrolysis chamber of the MOCVD reactor by a carrier gas that flows past the vaporization matrix. A schematic of the liquid source delivery system used as a part of the present invention is shown in FIG. 6. The source materials of the desired thin film compound were mixed stoichiometrically and held in the liquid form in an Erlenmeyer flask 110. The source was transferred to the flash vaporization chamber 102 by a Masterflex Economy drive 128 (basically a pump with a liquid flow meter) through a series of tubes as shown in FIG. 6. A needle valve 104 was inserted in the flow line to control the flow of the liquid and was connected to the source end by silicone tubing 106 and the vaporization chamber end by stainless steel tubing 108. The source was transferred from the flask 110 to the silicone tubing 106 through a glass rod. The vaporization chamber 102 was sealed on the source end by a flange 114. The stainless steel tube 108 that provides the path for the liquid source delivery was inserted into the vaporization chamber 102 through a tight fit hole drilled into the flange 114. The other end of the chamber 102 was connected to the pyrolysis chamber of the MOCVD reactor, the temperature of which is controlled by a preheat chamber temperature controller 132. The vaporization chamber 102 was heated as a whole and the temperature was controlled using a temperature controller 118. A preheated carrier gas ($N_2$) was used to transport the vaporized source from the vaporization chamber 102 to the pyrolysis chamber. The flow rate of the carrier gas was controlled using a mass flow controller 130. The carrier gas was sent through a preheat chamber 120 to heat the gases. This whole system is termed as direct liquid injection (DLI) and the MOCVD process performed using this method of source vaporization is known as DLI-MOCVD. See U.S. Pat. No. 5,204,314 by Kirlin.

For the deposition of the films, the substrates are loaded, the reaction chamber is sealed, and the system is evacuated to a desired pressure. The reaction chamber and/or substrate (hot wall and cold wall) are then heated to the desired temperature. If the bubbler (FIGS. 4 and 5) configuration is used for vaporization of the source materials, then the source bubblers are directly heated to the desired temperatures. If DLI-MOCVD is the preferred process, the source liquid is transferred to the vaporization chamber and vaporized at a temperature of around 250° C. on the evaporation matrix and carried to the deposition chamber by a carrier $N_2$ gas also preheated to the same temperature. At the start of the deposition, the source vapors accompanied by nitrogen carrier gas are sent through the bypass line; oxygen is sent through the reaction chamber to minimize the back diffusion of source vapors into the chamber. The bypass process is performed for about 3 minutes before beginning the deposition process. After the bypass process, the bypass valve is closed and the main valve of the reaction chamber is opened to start the deposition. The flow of the vapors from the bubblers or the DLI system is maintained for a predetermined deposition time. At the end of the deposition, the vaporization chamber and carrier gas are shut off, and the reactor is evacuated to base pressure before backfilling with air to atmospheric pressure. The samples are furnace-cooled below 100° C. before they were removed from the reactor.

The precursors for depositing the layered structure oxides can be one of metal alkyls, metal alkoxides, metal β-diketonates, and metallocenes. For example, the preferred precursors for depositing $SrBi_2(Ta_xNb_{2-x})O_9$ or $BaBi_2(Ta_xNb_{2-x})O_9$ are:

Ba: $Ba(thd)_2$ (Ba-tetramethylheptadione),

Sr: $Sr(thd)_2$ (Sr-tetramethylheptadione),

Bi: $Bi(C_6H_5)_3$ (Bi-triphenyl),

Ta: $Ta(OC_2H_5)_5$ (Ta-ethoxide),
Nb: $Nb(OC_2H_5)_5$ (Nb-ethoxide).

If the DLI system is used, these precursors are mixed in a solvent that is a 8:2:1 mixture in moles of tetrahydrofuran ($C_4H_8O$), iso-propanol ($C_3H_7OH$), and tetraglyme ($C_{10}H_{22}O_5$). If the conventional bubbler method is used, the individual precursors are packed into bubblers which are then heated to vaporize the precursors.

The $SrBi_2(Ta_xNb_{1-x})_2O_9$ films can be deposited at temperatures ranging from 450° C. to 800° C. The higher the deposition temperature, the higher the deposition rate. However, non-uniform and poor quality films form on the substrates, when the deposition temperatures are higher than 650° C. Excellent quality films can be deposited at temperatures lower than 600° C. The drawback for the relatively low temperature deposition is the deposition rate is low. Therefore, a two-step deposition method is utilized, that is, the films are first deposited at low temperatures (e.g., between 450° C. and 600° C.) for a short period of time (e.g., 5 minutes) then followed by a high temperature deposition (e.g., 600°–700° C.) for a longer period of time (e.g., 30–120 minutes) to obtain desired film thickness. This two-step deposition method produces excellent quality films comparing to the one-step deposition method, i.e. films directly deposited at 650° C. For the capacitor application, the ferroelectric film is deposited on a bottom electrode which is usually a polycrystalline material. For the one-step deposition method, when the deposition temperature is high, the heterogeneous nucleation and grain growth occur on this polycrystalline substrate simultaneously. Therefore, the resulting films show non-uniform crystalline structure with rough surface morphology. On the other hand, for the two-step deposition method, the first step deposition produces a thin and uniform nucleation layer without noticeable grain growth on the top of the substrate. This uniform layer provides a homogeneous nucleation and grain growth condition for the second step deposition.

Another important process to produce good ferroelectric properties of the deposited films is the post-deposition annealing. A two-step annealing process is necessary for $SrBi_2(Ta_xNb_{1-x})_2O_9$ films. The as deposited films are annealed at temperatures ranging from 650° C. to 750° C. in air or in $O_2$. After the first annealing, top electrodes are deposited on the top of the ferroelectric films, then followed by the second annealing. The second annealing is performed at temperatures ranging from 700° C. to 800° C. in air or in $O_2$. This will complete the process for fabricating the ferroelectric capacitors.

The typical MOCVD $SrBi_2Ta_2O_9$ thin films deposition conditions using liquid source delivery method are:

| Precursors: | $Sr(thd)_2$ Bi-triphenyl Ta-ethoxide |
|---|---|
| Solvents: | mixture of tetrahydrofuran, iso-propanol, and tetraglyme (=8:2:1 in molar ratio) |
| Solution concentration: | 0.025–0.2 mol/l |
| Solution delivery rate: | 0.1–10 ml/min |
| $N_2$ flow rate: | 300–1000 sccm |
| $O_2$ flow rate: | 300–1000 sccm |
| Vaporizer temperature: | 250–320° C. |
| Deposition temperature: | 450–800° C. |
| Deposition pressures: | 2–10 Torr |

Figure 7A:
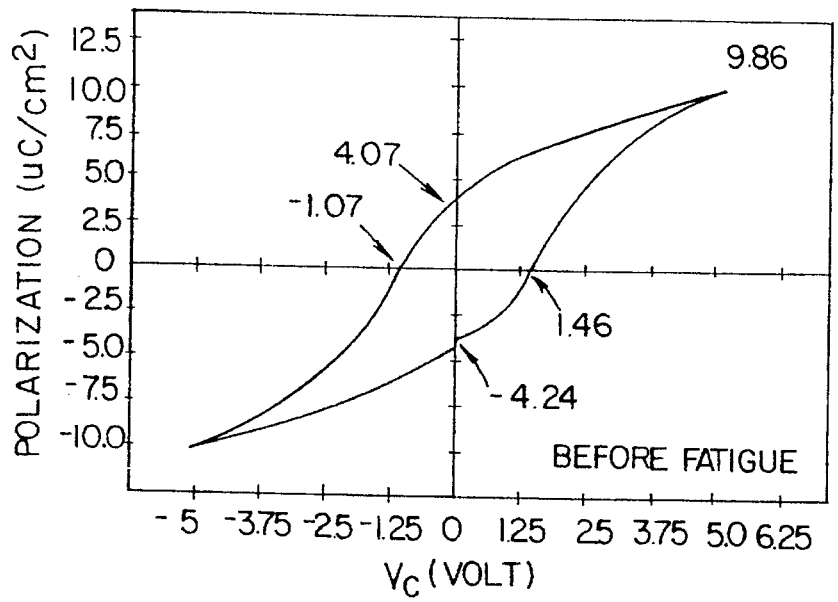
FIGS. 7A, 7B and C shows the hysteresis characteristics of $SrBi_2Ta_2O_9$ films before and after $1.4 \times 10^{10}$ cycles fatigue test at 5 V.
Figure 7B:
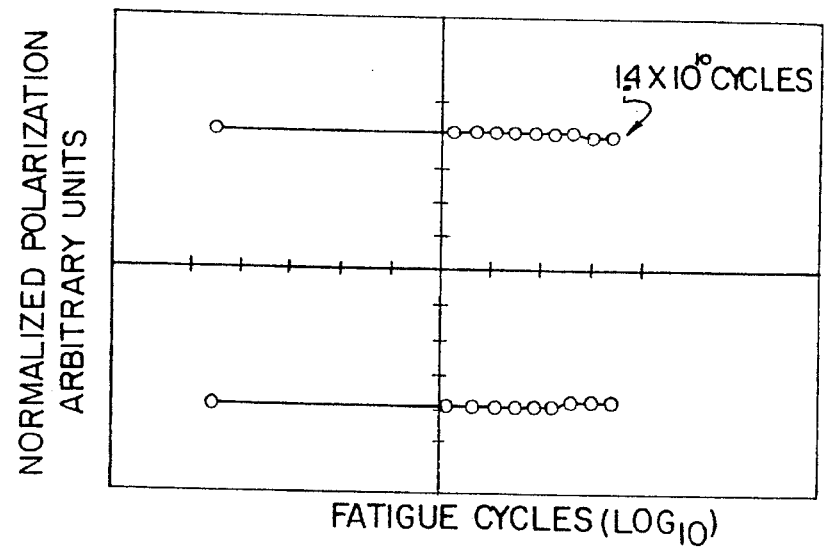
Figure 7C:
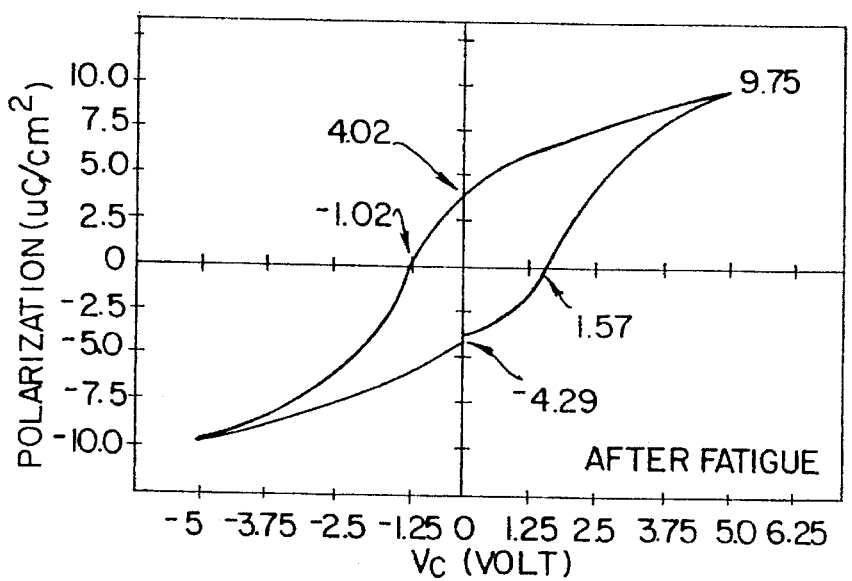

According to the above deposition and post-deposition annealing process, the resulting films were specular and showed excellent ferroelectric properties. FIG. 7 shows the hysteresis loops of MOCVD $SrBi_2Ta_2O_9$ films before and after $1.4 \times 10^{10}$ cycles fatigue test at 5 V. The sample showed a Pr value of 4.07 $\mu C/cm^2$ and a Ec value of 73 kV/cm before the fatigue test. As can be seen in the Figure, the sample showed a merely 1% loss of polarization after $1.4 \times 10^{10}$ cycles fatigue test. We believe, with this negligible polarization loss after $1.4 \times 10^{10}$ cycles fatigue test, the MOCVD $SrBi_2Ta_2O_9$ films definitely meet the industry requirement for nonvolatile memory applications.

Figure 8:
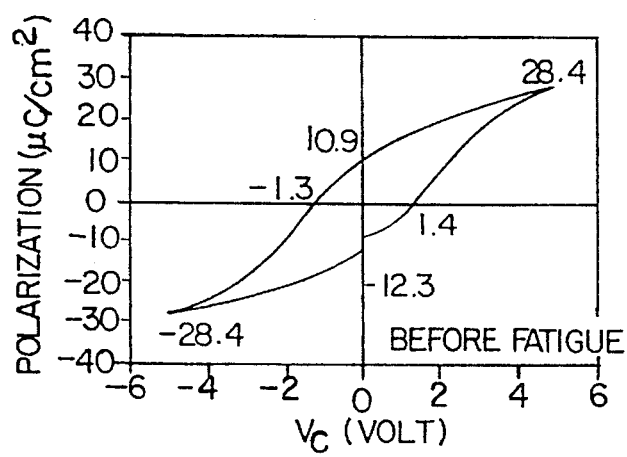
FIG. 8 shows hysteresis characteristics of $pt/SrBi_2(Ta_{0.8}Nb_{1.2})O_9/Pt$ capacitors before fatigue cycling. The SBTN films were deposited by pulsed laser deposition.
Figure 9:
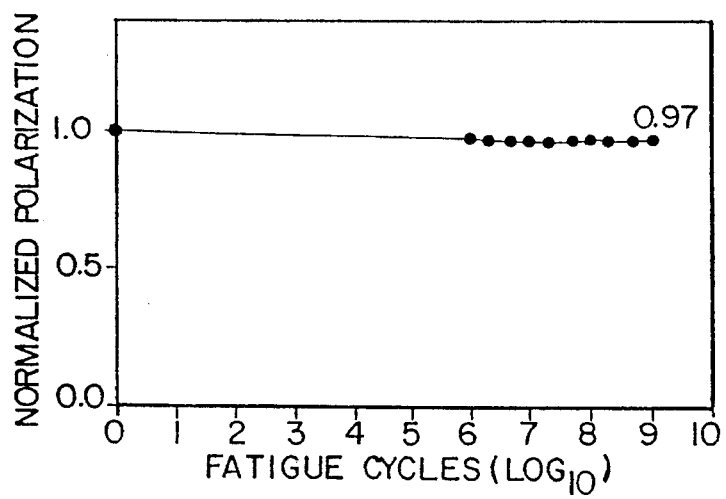
FIG. 9 shows the fatigue behavior of $pt/SrBi_2(Ta_{0.8}Nb_{1.2})O_9/Pt$ capacitors at 5 V and 1 MHz (bipolar square wave) frequency. The SBTN films were deposited by pulsed laser deposition.
Figure 10:
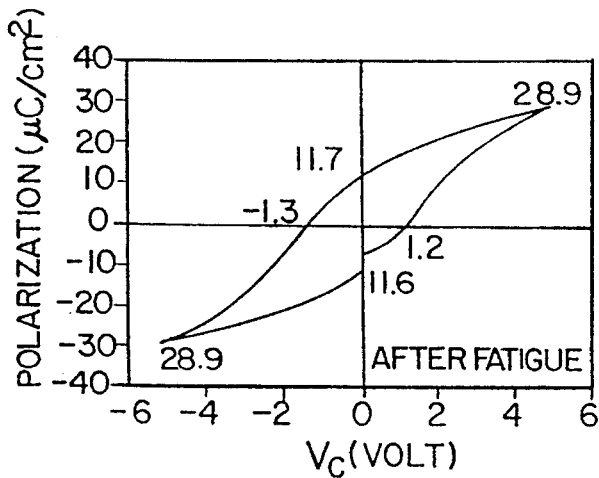
FIG. 10 shows hysteresis characteristics of $pt/SrBi_2(Ta_{0.8}Nb_{1.2})O_9/Pt$ capacitors after fatigue cycling. The SBTN films were deposited by pulsed laser deposition.

The superior ferroelectric properties of the layered structure oxides can be illustrated by FIGS. 8–10. In this particular example, the ferroelectric films shown in these figures are $SrBi_2(Ta_{0.8}Nb_{1.2})O_9$ deposited by pulsed laser deposition (PLD) method. The bottom and top electrodes were sputtered Pt. FIG. 8 shows the hysteresis characteristics of PLD $SrBi_2(Ta_{0.8}Nb_{1.2})O_9$ films at an applied voltage of 5 V. The hysteresis loop is well saturated at this voltage and shows a Pr value of 11 $\mu C/cm^2$ and an Ec value of 65 KV/cm. The fatigue tests on the films were performed using a 5 V square wave a.c. signal at a frequency of 1 MHz. FIG. 9 shows the result of the fatigue test performed up to $10^9$ cycles. The films show very low fatigue rate. The hysteresis properties on the films measured after cycling are shown in FIG. 10. The hysteresis properties of the films before and after cycling were similar. The leakage current density values for these films were measured as a function of applied voltage. At an applied voltage of 3 V, the films showed a leakage current density of $10^7 A/cm^2$. The measured resistivity of films were typically of the order of $10^{-12}$ ohm-cm.

The particular embodiments described and shown in the drawings are for the purposes of example and should not be construed to limit the invention which will be described in the claims. For example, the process of invention can be used to fabricate high quality layered structure oxide thin films for ferroelectric nonvolatile random access memory applications. The process can also be applied to fabricate these materials for other applications such as piezoelectric, pyroelectric, electro-optic etc. The process may be applied to deposit these materials onto structures (may be with different dimensions) other than that described specifically (capacitors) in the present invention. The process may also be modified to add further processing steps. However, the basic inventive concept of the invention is still the same.

What is claimed is:

1. A method of depositing a ferroelectric layered structure oxide thin film on a substrate by metalorganic chemical vapor deposition, comprising the steps of: maintaining a substrate at a reduced pressure in a chemical vapor deposition reactor; heating said substrate in the chemical vapor deposition reactor; vaporizing metalorganic precursors; transporting vapors of said precursors by a carrier gas or an oxidizing agent or both, and/or a diluent gas into said chemical vapor deposition reactor; decomposing said vapors at a lower temperature between 450° C. and 600° C.; and decomposing said vapors at a higher temperature between 550° C. and 700° C. to form a thin film of the ferroelectric layered structured oxide on said substrate.

2. The method of claim 1, wherein said ferroelectric layered structure oxide is at least one of the compounds:

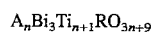

$A_nBi_3Ti_{n+1}RO_{3n+9}$

$ABi_2R_2O_9$

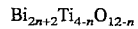

$Bi_{2n+2}Ti_{4-n}O_{12-n}$

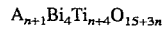

$A_{n+1}Bi_4Ti_{n+4}O_{15+3n}$ where A=Ca, Pb, Sr, or Ba; and R=Nb or Ta; and n=0 or 1.

3. The method of claim 1, wherein said substrate is at least one of: semiconductor composed of at least one of Si, SiO$_2$-coated Si, or GaAs; a single crystal insulator composed of at least one of sapphire, ZrO$_2$, MgO, SrTiO$_3$, BaTiO$_3$, or PbTiO$_3$; or a complex integrated circuit.

4. The method of claim 3, wherein said substrate is coated with a conducting material comprising at least one of: a metal electrode including Pt, Al, Au, or Pd; a conducting oxide electrode including MO$_x$ (0<x<2) where M is at least one of Ru, Rh, Ir, Os, Re or lanthanum strontium cobaltate; a conducting nitride electrode including TiN or ZrN; and a superconducting oxide including YBa$_2$Cu$_2$O$_{7-x}$ or Bi$_2$Sr$_2$Ca$_2$Cu$_3$O$_{10}$.

5. The method of claim 4, wherein said substrate and said coating are separated by an adhesion layer.

6. The method of claim 1, wherein said precursors are at least one of: alkyls of elements comprising said layered structure oxide film; alkoxides of elements comprising said layered structure oxide film; β-diketonates of elements comprising said layered structure oxide film; metallocenes of elements comprising said layered structure oxide film; or combination of at least two of alkyls, alkoxides, β-diketonates, and metallocenes of elements comprising said layered structure oxide film.

7. The method of claim 1, wherein said precursors are Ba-tetramethylheptadione, Ba-hexafluoroacetylacetonate, Ba-pentamethylcyclopentadienyl, or Ba-heptaflurodimethyloctadione for a barium-component; Sr-tetramethylheptadione, Sr-hexafluoroacetylacetonate, or Sr-heptaflurodimethyloctadione for a strontium-component; Bi-tetramethylheptadione or triphenylbismuth for a bismuth-component; Ta-ethoxide, Ta-methoxide, Ta-tetraethoxyacetylacetonate, Ta-n-butoxide, or Ta-trifluoroethoxide for a tantalum-component; and Nb-ethoxide or Nb-tetramethylheptadione for a niobium-component.

8. The method of claim 7, wherein all of said precursors are dissolved with a solvent to form a precursor solution, the solvent being one or a mixture of the following: aromatic hydrocarbon, cyclic hydrocarbon, or chain hydrocarbon.

9. The method of claim 8, wherein said solvent is a 8:2:1 mixture in moles of tetrahydrofuran (C$_4$H$_8$O), isopropanol (C$_3$H$_7$OH), and tetraglyme (C$_{10}$H$_{22}$O$_5$).

10. The method of claim 1, wherein said ferroelectric material has a composition SrBi$_2$(Ta$_x$Nb$_{2-x}$)O$_9$ with x ranging from 0 to 2.

11. The method of claim 1, further comprising the steps, after said second depositing step, of: annealing said films at a temperature between 650° C. and 750° C.; depositing a top electrode on top of said films; and annealing said films and top electrode at a temperature between 700° C. and 800° C.

12. The method of claim 11, wherein only said substrate is heated and said reactor is maintained at a lower temperature.

13. The method of claim 11, wherein said entire reactor is heated.

14. The method of claim 11, wherein the reduced pressure is from about 10$^{-3}$ Torr to 760 Torr.

15. The method of claim 11, wherein said precursors are vaporized at temperatures between 60° and 250° C. in bubblers.

16. The method of claim 11, wherein said precursors are held as liquids in a solvent and vaporized at temperatures between 60° C. and 300° C. on a vaporization matrix.

17. The method of claim 11, wherein the oxidizing agent is at least one of oxygen and nitrous oxide.

18. The method claim 13, wherein said oxidizing flows at between 200 and 2000 sccm into said chemical vapor deposition reactor.

19. The method of claim 11, wherein said carrier gas is at least one of nitrogen and an inert gas.

20. The method of claim 11, wherein said carrier gas and the mixture of said carrier gas and the source vapors flow at between 1 and 2000 sccm into said chemical vapor deposition reactor.

21. The method of claim 11, wherein the diluent gas is at least one of nitrogen and an inert gas.

22. The method of claim 11, wherein the decomposing of the vapors in the reactor is enhanced by a plasma.

23. The method of claim 11, where the decomposing of the vapors in the reactor is enhanced by a UV-lamp.

24. The method of claim 11, further comprising manufacturing the deposited film into a ferroelectric device.

25. The method of claim 11, further comprising manufacturing the deposited film into a nonvolatile memory device.

26. The method of claim 11, further comprising manufacturing the deposited film into a capacitor device.

27. The method of claim 11, wherein said ferroelectric material has a composition SrBi$_2$(Ta$_x$Nb$_{2-x}$)O$_9$ with x ranging from 0 to 2.

28. A method of depositing a ferroelectric layered structure oxide thin film on a substrate by metalorganic chemical vapor deposition, comprising the steps of: maintaining a substrate at a reduced pressure in a chemical vapor deposition reactor; heating said substrate in the chemical vapor deposition reactor; vaporizing metalorganic precursors; transporting vapors of said precursors by a carrier gas or an oxidizing agent or both, and/or a diluent gas into said chemical vapor deposition reactor; decomposing said vapors to form a thin film of the ferroelectric layered structure oxide on said substrate; and annealing said film at a temperature between 650° C. and 750° C.; depositing a top electrode on said thin film; and annealing said film and said top electrode at a temperature between 700° C. and 800° C.

29. The method of claim 28 wherein said substrate is at least one of semiconductor composed of at least one of Si, SiO$_2$-coated Si or GaAs; a single crystal insulator composed of at least one of sapphire, ZrOa, MgO, SrTiO$_3$, BaTiO$_3$, or PbTiO$_3$; or a complex integrated circuit.

30. The method of claim 29, wherein said substrate is coated with a conducting material comprising at least one of: a metal electrode including Pt, Al, Au, or Pd; a conducting oxide electrode including MO$_x$ (0<x<2) where M is at least one of Ru, Rh, Ir, Os, Re or lanthanum strontium cobaltate; a conducting nitride electrode including TiN or ZrN; and a superconducting oxide including YBa$_2$Cu$_2$O$_{7-x}$ or Bi$_2$Sr$_2$Ca$_2$Cu$_3$O$_{10}$.

31. The method of claim 30, wherein said substrate and said coating are separated by an adhesion layer.

32. The method of claim 28, wherein said step of decomposing said vapors to form a thin film of said ferroelectric layered structure oxide on said substrate is comprised of depositing said film at a temperature between 450° C. and 700° C.

33. The method of claim 28, wherein said ferroelectric layered structure oxide is at least one of the compounds:

$A_n Bi_3 Ti_{n+1} RO_{3n+9}$ $ABi_2 R_2 O_9$ $Bi_{2n+2} Ti_{4-n} O_{12-n}$ $A_{n+1} Bi_4 Ti_{n+4} O_{15+3n}$ where A=Ca, Pb, Sr, or Ba; and R=Nb or Ta; and n=0 or 1.

34. The method of claim 28, wherein said ferroelectric material has a composition SrBi$_2$(Ta$_x$Nb$_{2-x}$)O$_9$ with x ranging from 0 to 2.

35. The method of claim 28, wherein said precursors are at least one of: alkyls of elements comprising said layered structure oxide film; alkoxides of elements comprising said layered structure oxide film; β-diketonates of elements comprising said layered structure oxide film; metallocenes of elements comprising said layered structure oxide film; or combination of at least two of alkyls, alkoxides, β-diketonates, and metallocenes of elements comprising said layered structure oxide film.

36. The method of claim 28 wherein said Ba-tetramethylheptadione, Ba-hexafluoroacetylacetonate, Ba-pentamethylcyclopentadienyl, or Ba-heptaflurodimethyloctadione for a barium-component; Sr-tetramethylheptadione, Sr-hexafluoroacetylacetonate, or Sr-heptaflurodimethyloctadione for a strontium-component; Bi-tetramethylheptadione or triphenylbismuth for a bismuth-component; Ta-ethoxide, Ta-methoxide, Ta-tetraethoxyacetylacetonate, Ta-n-butoxide, or Ta-trifluoroethoxide for a tantalum-component; and Nb-ethoxide or Nb-tetramethylheptadione for a niobium-component.

37. The method of claim 28 wherein said decomposing step is comprised of the steps of depositing said film at a lower temperature between 450° C. and 600° C.; and depositing said film at a higher temperature between 600° C. and 700° C.

* * * * *